United States Patent [19]
Gonen et al.

[11] Patent Number: 5,903,149
[45] Date of Patent: May 11, 1999

[54] THREE-DIMENSIONAL LOCALIZED PROTON NMR SPECTROSCOPY USING A HYBRID OF ONE-DIMENSIONAL HADAMARD WITH TWO-DIMENSIONAL CHEMICAL SHIFT IMAGING

[75] Inventors: Oded Gonen, Cheltenham, Pa.; Gadi Goelman, Rosh Haaein, Israel; John S. Leigh; Lizann Bolinger, both of Philadelphia, Pa.

[73] Assignee: The Trustees of the University of Pennsylvania, Philadelphia, Pa.

[21] Appl. No.: 08/843,030

[22] Filed: Apr. 11, 1997

[51] Int. Cl.[6] .................................................. G01V 3/00
[52] U.S. Cl. .................................................. 324/307
[58] Field of Search .................................. 324/307, 309, 324/300, 310, 312, 314

[56] References Cited

U.S. PATENT DOCUMENTS

| | | | |
|---|---|---|---|
| 5,374,889 | 12/1994 | Leach et al. | 324/309 |
| 5,657,758 | 8/1997 | Posse et al. | 324/307 |
| 5,709,208 | 1/1998 | Posse et al. | 324/307 |

OTHER PUBLICATIONS

Alger, et al., "Absolute Quantitation of Short TE Brain [1]H–MR Spectra and Spectroscopic Imaging Data," *Journal of Computer Assisted Tomography*, vol. 17, No. 2, 1993, pp. 191–199.

Bolinger, et al., "Hadamard Spectroscopic Imaging (HSI) for Mulitvolume Localization," *Journal of Magnetic Resonance*, 80, 1988, pp. 162–167.

Brown, "Practical Applications of Chemical Shift Imaging," *NMR in Biomedicine*, vol. 5, 1992, pp. 238–243.

Dreher, et al., "Double–Echo Multislice Proton Spectroscopic Imaging Using Hadamard Slice Encoding," *Magn. Reson. Med.*, vol. 31, 1994, pp. 596–600.

Duyn, et al., "Fast Proton Spectroscopic Imaging of Human Brain Using Multiple Spin–Echoes," *Magn. Reson. Med.*, vol. 30, 1993, pp. 409–414.

Duyn, et al., "Multisection Proton MR Spectroscopic Imaging of the Brain[1]," *Radiology*, vol. 188, 1993, pp. 277–282.

Ernst, et al., "Application of Fourier Transform Spectroscopy to Magnetic Resonance," *The Review of Scientific Instruments*, vol. 37, No. 1, 1966, pp. 93–102.

Frahm, et al., "Localized Proton NMR Spectroscopy in Different Regions of the Human Brain in vivo. Relaxation Times and Concentrations of Cerebral Metabolites," *Magnetic Resonance in Medicine*, vol. 11, 1989, pp. 47–63.

Goelman, et al., "Transverse Hadamard Spectroscopic Imaging Technique," *Journal of Magnetic Resonance*, vol. 89, 1990, pp. 437–454.

(List continued on next page.)

*Primary Examiner*—Louis Arana
*Attorney, Agent, or Firm*—Woodcock Washburn Kurtz Mackiewicz & Norris LLP

[57] ABSTRACT

Acquisition of three-dimensional image-guided localized proton spectroscopy ($^1$H-MRS) in the human brain is achieved on a standard clinical imager with a hybrid of chemical shift imaging (CSI) and transverse Hadamard spectroscopic imaging (HSI). 16×16×4 arrays of 3.5 and 1 ml voxels were obtained in 27 minutes. The spatially-selective HSI 90° pulses were incorporated naturally into a PRESS double spin-echo sequence to subdivide the VOI into 4 partitions along its short axis. Two-dimensional CSI is performed along the other long axes. Because the hybrid excites the spins in the entire VOI, a $\sqrt{N}$ signal-to-noise-ratio (SNR) gain per given examination time is realized compared to sequentially interleaving N two-dimensional slices. A twofold gain in sensitivity is demonstrated in the brain for N=4.

7 Claims, 13 Drawing Sheets

OTHER PUBLICATIONS

Gonen, et al., "Dual Interleaved $^1$H and Proton–Decoupled–$^{31}$P in Vivo Chemical Shift Imaging of Human Brain," *Magnetic Resonance in Medicine*, vol. 32, 1994, pp. 104–109.

Gonen, et al., "Hybrid Three Dimensional (1D–Hadamard, 2D–Chemical Shift Imaging) Phosphorus Localized Spectroscopy of Phantom and Human Brain," *Magnetic Resonance in Medicine*, vol. 33, 1995, pp. 300–308.

Gonen, et al., "In Vivo Phoshorus Polarization Transfer and Decoupling from Protons in Three–Dimensional Localized Nuclear Magnetic Resonance Spectroscopy of Human Brain," *f Magnetic Resonance in Medicine*, vol. 37, 1997, pp. 301–306.

Hu, et al., "A Fast, Reliable, Automatic Shimming Procedure Using $^1$H Chemical–Shift–Imaging Spectroscopy," *Journal of Magnetic Resonance, Series B*, vol. 108, 1995, pp. 213–219.

Hugg, et al., "Elevated Lactate and Alkalosis in Chronic Human Brain Infarction Observed by $^1$H and $^{31}$P MR Spectroscopic Imaging," *Journal of Cerebral Blood Flow and Metabolism*, vol. 12, 1992, pp. 734–744.

Hugg, et al., "Lateralization of human focal epilepsy by $^{31}$P magnetic resonance spectroscopic imaging ", *Neurology*, vol. 42, 1992 , pp. 2011–2018.

Koch, et al., "Theoretical Description, Measurement, and Correction of Localization Errors in $^{31}$P Chemical–Shift Imaging," *Journal of Magnetic Resonance, Series B*, vol. 104, 1994, pp. 199–211.

Liang, et al., "Constrained Reconstruction Methods in MR Imaging, " *Reviews of Magnetic Resonance in Medicine*, vol. 4, 1992, pp. 67–185.

Majors, et al., "Short Echo Time Proton Spectroscopy of Human Brain Using a Gradient Head Coil," *Magnetic Resonance Imaging*, vol. 10, 1992, pp. 649–654.

Michaelis, et al., "On the Identification of Cerebral Metabolites in Localized $^1$H NMR Spectra of Human Brain in Vivo," *NMR Biomed*, vol. 4, 1991, pp. 90–98.

Moonen, et al., "Proton Spectroscopic Imaging of Human Brain," *Journal of Magnetic Resonance*, vol. 98, 1992, pp. 556–575.

Negendank, et al., "Proton magnetic resonance spectroscopy in patients with glial tumors: a multicenter study," *J. Neurosurg.*, vol. 84, 1996, pp. 449–458.

Negendank, "Studies of Human Tumors by MRS: A Review," *NMR In Biomedicine*, vol. 5, 1992, pp. 303–324.

Nelson et al., "The Accuracy of Quantification from 1D NMR Spectra Using the PIQABLE Algorithm," *Journal of Magnetic Resonance*, vol. 84, 1989, pp. 95–109.

Posse, et al., "Short Echo Time Proton MR Spectroscopic Imaging," *Journal of Computer Assisted Tomography*, vol. 17, No. 1, 1993, pp. 1–14.

Preul, et al., "Linear Discriminant Analysis Based on Proton MR Spectroscopic Imaging of Human Brain Tumours Improves Pre–Operative Diagnosis," *2nd SMR San Francisco*, 1994 p. 125.

Shungu, et al., "Sensitivity and Localization Enhancement in Multinuclear in Viv NMR Spectroscopy by Outer Volume Presaturation," *Mag. Reson. Med.*, vol. 30, 1993, pp. 661–671.

Stoyanova, et al., "Application of Principal–Component Analysis for NMR Spectral Quantitation," *Journal of Magnetic Resonance, Series A*, vol. 115, 1995, pp. 265–269.

Toft, et al., "T1, T2, and Concentrations of Brain Metabolites in Neonates and Adolescents Estimated with H–1 MR Spectroscopy[1]." *J. Magn. Reson. Imag.*, vol. 4, 1994, pp. 1–5.

Vigneron, et al., "Chemical Shift Imaging of Human Brain: Axial, Sagittal, and Coronal P–31 Metabolite Images[1]," *Radiology*, vol. 177, 1990, pp. 643–649.

Wang, et al., Errors of Fourier Chemical–Shift Imaging and Their Corrections. *Journal of Magnetic Resonance*, vol. 92, 1991, pp. 64–72.

Waugh, "Sensitivity of Fourier Transform NMR Spectroscopy of Slowly Relaxing Systems," *Journal of Molecular Spectroscopy*, vol. 35, 1970, pp. 298–305.

Duijn, et al., "3D Phase Encoding $^1$H Spectroscopic Imaging of Human Brain," *Magnetic Resonance Imaging*, vol. 10, 1992, pp. 315–319.

Richard R. Ernst, "Sensitivity Enhancement in Magnetic Resonance," *Adv. in Magn. Reson.*, vol. 2, 1966, pp. 1–135.

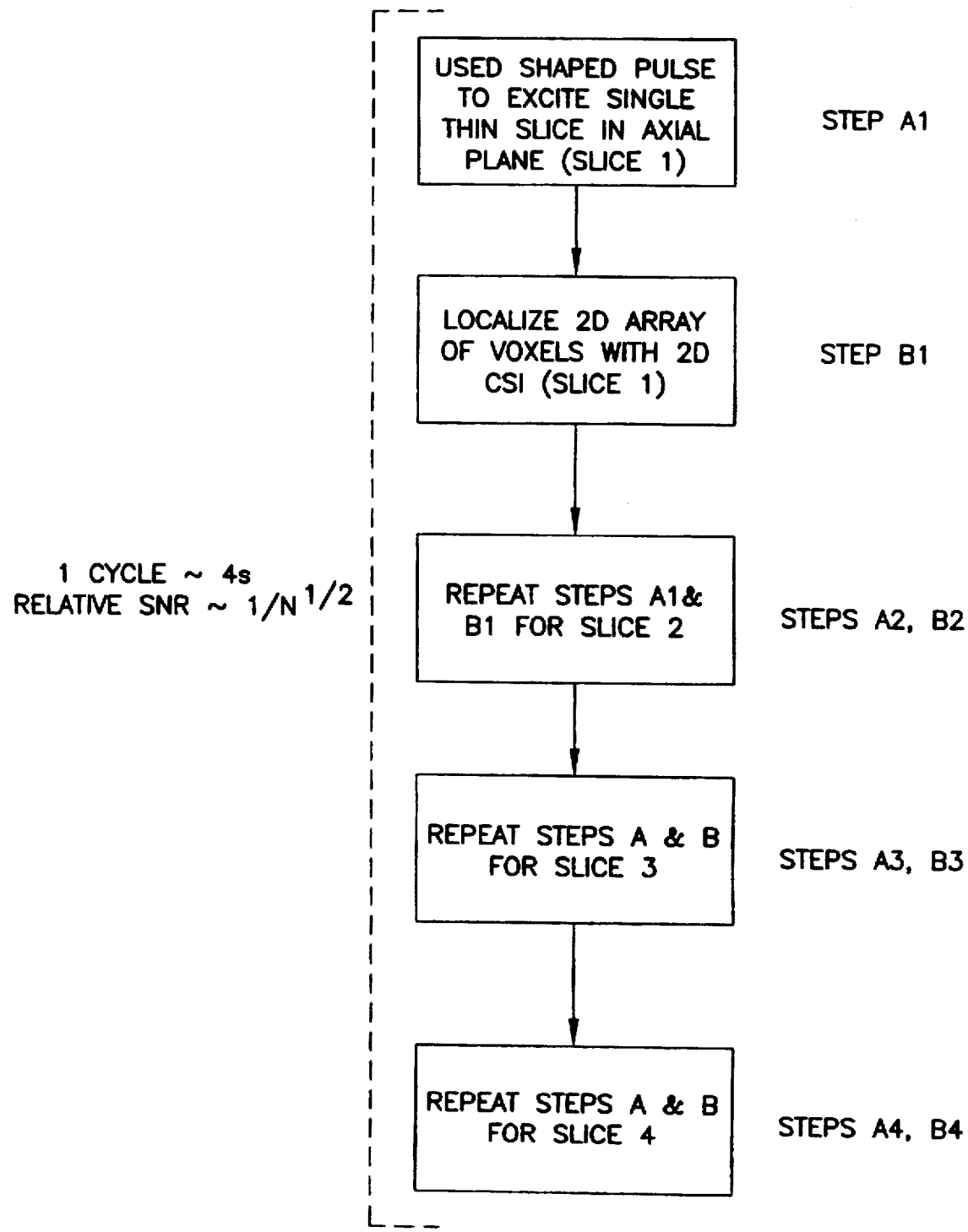

INVENTION

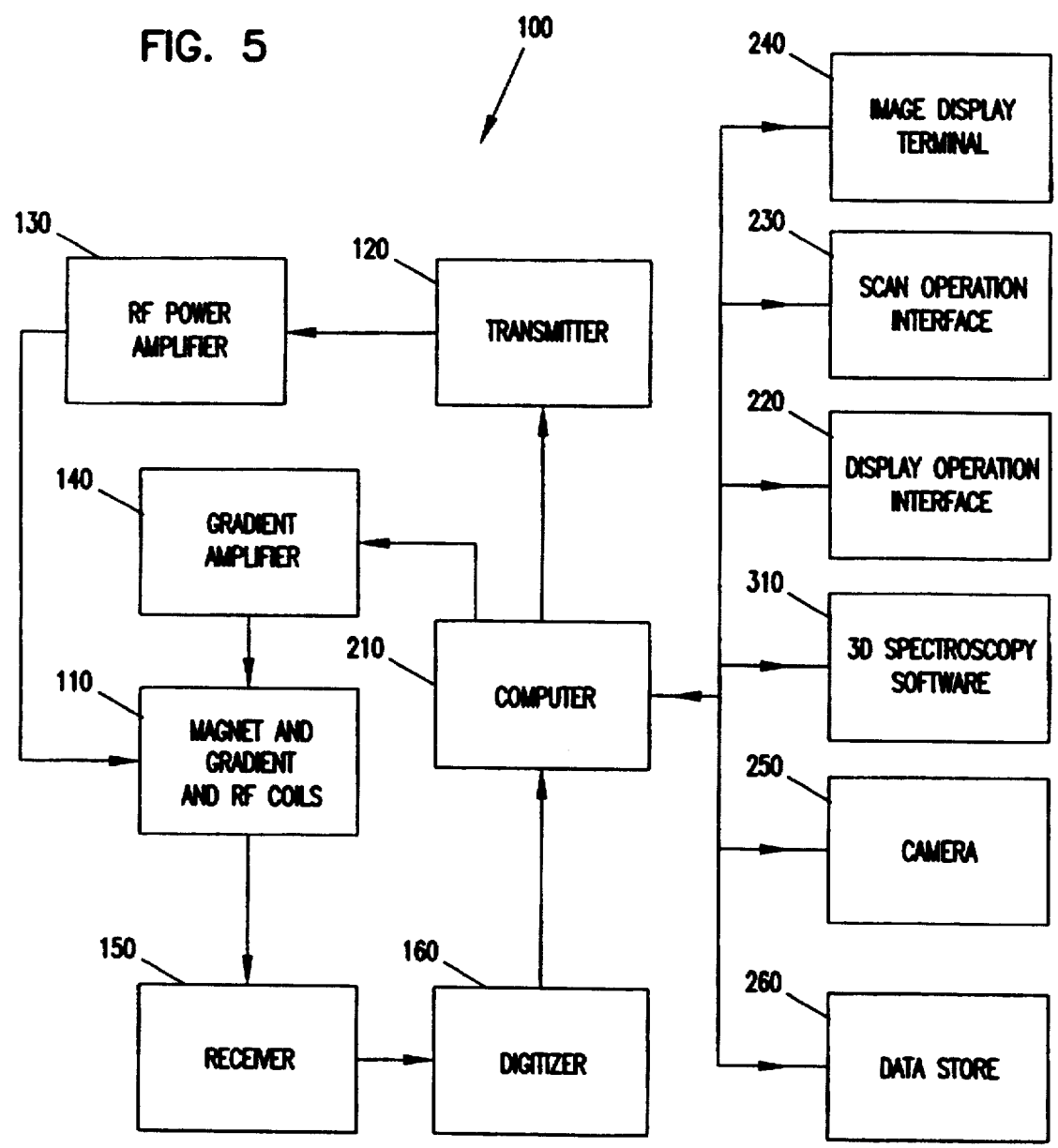

++++

+−+−

++−−

+−−+

THREE-DIMENSIONAL LOCALIZED PROTON NMR SPECTROSCOPY USING A HYBRID OF ONE-DIMENSIONAL HADAMARD WITH TWO-DIMENSIONAL CHEMICAL SHIFT IMAGING

BACKGROUND OF THE INVENTION

1. Field of the Invention

The present invention relates to a magnetic resonance imaging technique for obtaining three-dimensional images of an image slice, and more particularly, to a three-dimensional spectroscopic imaging technique which is a hybrid of one-dimensional Hadamard spectroscopic imaging and two-dimensional chemical shift imaging that allows all slices in the field of view to be simultaneously acquired.

2. Description of the Prior Art

As described by Moonen, et al. in an article entitled "Proton Spectroscopic Imaging of Human Brain," *J. Magn. Reson.*, Vol. 98, pp. 556–575 (1992), by Shungu, et al. in an article entitled "Sensitivity and Localization Enhancement in Multinuclear in vivo NMR Spectroscopy by Outer Volume Presaturation," *Magn. Reson. Med.*, Vol. 30, pp. 661–671 (1993), and by Duyn, et al. in an article entitled "Multisection Proton MR Spectroscopic Imaging of the Brain," *Radiology*, Vol. 188, pp. 277–282 (1993), proton MR studies of organs such as the human brain require suppression of the subcutaneous lipids and bone marrow signals so that they do not contaminate the much smaller brain metabolite signals. This is done most effectively by outer volume suppression (OVS) combined with selective-excitation of the volume of interest (VOI). As described in the for-mentioned Moonen, et al. and Duyn, et al. articles, as well as by Alger, et al. in an article entitled "Absolute Quantitation of Short TE Brain $^1$H MR Spectra and Spectroscopic Imaging Data," *J. Comput. Assist. Tomogr.*, Vol. 17, pp. 191–199 (1993), by Posse, et al. in an article entitled "Short Echo Time Proton MR Spectroscopic Imaging," *J. Comput. Assist. Tomogr.*, Vol. 17, pp. 1–14 (1993), and by Duyn, et al. in an article entitled "Fast Proton Spectroscopic Imaging of Human Brain Using Multiple Spin Echoes," *Magn. Reson. Med.*, Vol 30, pp. 409–414 (1993), finer localization within that volume is achieved with two-dimensional chemical shift imaging. As described in the above-mentioned articles, OVS favors a VOI within an axial or paraxial slice so the fat at the rim can easily be saturated by spatially-selective RF pulses. For these pulses to contain the skull's curvature when imaging the brain, the slice must be thin (a few centimeters), ruling out the use of chemical shift imaging in that direction. Therefore, to localize, a one voxel thick slice is excited and two-dimensional chemical shift imaging is performed in its plane. Three-dimensional coverage is achieved by sequentially interleaving N (usually four) single-slices.

In particular, as shown in prior art FIG. 1, the prior art proton ($^1$H) NMR spectroscopy ($^1$H-MRS) in the human brain, for example, comprises selective excitation of a single, thin slice (in an axial plane) as shown in step A1, followed by localization of a two-dimensional array of voxels within the plane of that slice with two-dimensional chemical shift imaging (CSI) (step B1). This process is then repeated for each slice (steps A2, B2, A3, B3, A4, and B4). This approach is dictated by the need to suppress the undesirable fat signals of skull bone, skin, and various other subcutaneous lipids at the edges of the slice.

On the other hand, if localization of a larger volume is desired, several slices (usually 4, but sometimes more) may be acquired in an interleaved fashion as shown in FIG. 2(a). However, because of the nature of interleaving, each of the N slices is sampled for only a fraction (1/N) of the cycle time required to complete a cycle of sampling all slices and is idle for the rest ((N−1)/N) of the time. Because the acquisition time of each slice is comparable with the transverse relaxation time of protons, $P_2$ (~1 second), if N=4 slices are to be sampled, each slice will be "revisited" for only 1 second of every 4 second cycle, with a resulting relative signal-to-noise ratio (SNR) of $1/N^{1/2}$.

In particular, the problem with slice-interleaving is that because the $T_2$s of in vivo $^1$H cerebral metabolites are long (Frahm, et al. in an article entitled "Localized Proton NMR Spectroscopy in Different Regions of the Human Brain in vivo. Relaxation Times and Concentration of Cerebral Metabolites," *Magn. Reson. Med.*, Vol. 11, pp. 47–63 (1989), and Toft, et al. in an article entitled "$T_1$, $T_2$ and Concentrations of Brain Metabolites in Neonates and Adolescents Estimated with H-1 MR Spectroscopy," *J. Magn. Reson. Imag.*, Vol. 4, pp. 1–5 (1994) found the $T_2$s to be 100–500 ms), the free induction decay (FID) from the $i^{th}$ slice must be acquired for $T_{acq.}(i) \approx 1$ second. This brings the recycle time, TR, to $$\sum_{i=1}^{N} T_{acq.}(i) \geq N$$

seconds, which is inefficient in SNR/unit-time, since it has been shown in the afore-mentioned Frahm, et al. And Toft, et al. articles, as well as in an article by J. S. Waugh entitled "Sensitivity in Fourier Transform NMR Spectroscopy of Slowly Relaxing Systems," *J. Mol. Spec.*, Vol. 35, pp. 298–305 (1970), and in an article by R. R. Ernst entitled "Sensitivity Enhancement in Magnetic Resonance," *Adv. in Magn. Reson.*, Vol. 2, pp. 1–135 (1966), that the $T_1$s of $^1$H brain metabolites, 1–1.5 seconds, are significantly shorter. Consequently, good voxel SNR in a 4 slice-interleaved experiment requires approximately 45 minutes of acquisition.

It is desired to substantially reduce the signal acquisition time for such spectroscopic imaging so as to decrease the discomfort to the patient without sacrificing SNR. In addition, it is desired that the resulting images exhibit improved localization and improved fat suppression. The present invention has been designed to meet these needs.

SUMMARY OF THE INVENTION

The above-mentioned inefficiencies in the MR spectroscopy art are removed in accordance with the invention by simultaneously acquiring a signal from all N slices in each and every acquisition. This is accomplished by exciting a thicker slice in a conventional manner except that the selective-excitation pulse for the slice also Hadamard encodes partitions (sub-slices) across the width of the slice, typically in the short direction, perpendicular to the axial plane. Two-dimensional CSI is still employed along the other two longer directions in the axial plane in a conventional manner. As a result of the Hadamard/CSI combination, the spins of the entire VOI are excited and the $^1$H signal simultaneously acquired for all N slices in the VOI every time. Since both methods excite the spins in the entire VOI, the TR can be made equal to $T_{acq.}(i)$ to produce an N-fold increase in the number of acquisitions per given time and a $\sqrt{N}$ gain in the SNR compared with slice-interleaving. In addition, HSI which isolates well with 4 partitions, is suited to the short axis of the VOI.

Thus, in accordance with the invention, the number of acquisitions of each Hadamard encoded partition is increased by N and the SNR is increased by $N^{1/2}$ for the same amount of measurement time as compared with the slice interleaving technique described above. In addition, the inventors have discovered that only a certain type of Hadamard matrix, one that fulfills the condition that the sum of the elements of every row (except 1) is zero, yields the best results.

The Hadamard encoded partitions are then reconstructed at the end of the scanning by post-processing in a computer. A computer graphic software interface to the MR imaging computer allows the operator to interactively determine over NMR images where to place the VOI for performing the hybrid three-dimensional spectroscopy and to subsequently request generation of the RF pulses required to perform the measurement. The resulting waveforms can then be generated by any conventional NMR imaging device which is capable of producing shaped pulses.

BRIEF DESCRIPTION OF THE DRAWINGS

The objects and advantages of the invention will become more apparent and more readily appreciated from the following detailed description of presently preferred exemplary embodiments of the invention taken in conjunction with the accompanying drawings, of which:

FIG. 1 illustrates a prior art CSI technique which uses sequential interleaving to acquire a three-dimensional spectroscopic image.

FIG. 5 is a block diagram of a magnetic resonance imager programmed to provide hybrid three-dimensional Hadamard and chemical shift imaging in accordance with the techniques of the invention.

DETAILED DESCRIPTION OF THE PREFERRED EMBODIMENTS

Figure 2A:
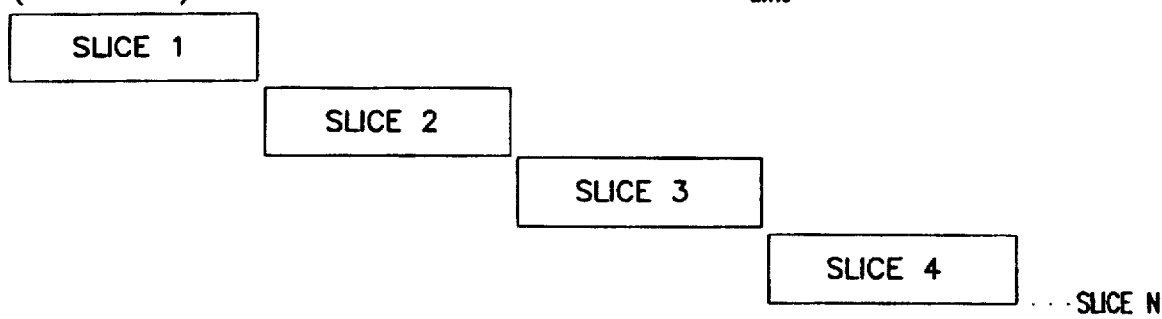
FIGS. 2(a) and 2(b) respectively illustrate a conventional sequential interleaved acquisition of N=4 slices and a three-dimensional hybrid of CSI and HSI in accordance with the invention.

A technique for three-dimensional image-guided localized proton spectroscopy in accordance with presently preferred exemplary embodiments of the invention will be described below with reference to FIGS. 2–12. It will be appreciated by those of ordinary skill in the art that the description given herein with respect to those figures is for explanatory purposes only and is not intended in any way to limit the scope of the invention. All questions regarding the scope of the invention may be resolved by referring to the appended claims.

Those skilled in the art will appreciate that chemical shift imaging (CSI) is widely used to obtain two-dimensional arrays of localized $^1$H spectra in the human brain. For example, such techniques are described in the aforementioned Moonen, et al. and Duyn, et al. articles as well as by Duijn, et al. in an article entitled "3D Phase Encoding $^1$H Spectroscopic Imaging of Human Brain," *Magn. Reson. Imag.*, Vol. 10, pp. 315–319 (1992), by Hugg, et al. in an article entitled "Lateralization of Human Focal Epilepsy by $^{31}$P Magnetic Resonance Spectroscopic Imaging," *Neurology*, Vol. 42, pp. 2011–2018 (1992), and by Gonen, et al. in an article entitled "Interleaved Heteronuclear ($^1$H-$^{31}$P) Two Dimensional Chemical Shift Imaging of in vivo Human Brain," *Magn. Reson. Med.*, Vol. 32, pp. 104–109 (1994). As described by Vigneron, et al. In an article entitled "Chemical Shift Imaging of Human Brain: Axial, Sagittal and Coronal $^{31}$P Metabolite Images," *Radiology*, Vol. 177, pp. 643–649 (1990), since CSI obtained spectra can be voxel-shifted in post-processing, precise time-consuming placement of the VOI over the pathology during the examination is unnecessary.

However, CSI suffers from two disadvantages. First, unless selective excitation and/or OVS are used, the field-of-view (FOV) must be larger than the object to prevent aliasing extraneous signals. Second, spectral contamination from outside the voxel occurs as a result of the point spread function (psf). As explained by Wang, et al. in an article entitled "Errors of Fourier Chemical Shift Imaging and Their Corrections," *J. Magn. Reson.*, Vol. 92, pp. 64–72 (1991), by Liang, et al. in an article entitled "Constrained Reconstruction Methods in MR Imaging," *Rev. Magn. Reson. Med.*, Vol. 4, pp. 57–185 (1992), and by Koch, et al. in an article entitled "Theoretical Description, Measurement and Correction of Localization Errors in $^{31}$P Chemical-Shift Imaging," *J. Magn. Reson. Ser.* B, Vol. 104, pp. 199–211 (1994), this intrinsic artifact, generally known as "voxel bleed," is caused by restricted k-space sampling and, as described by T. R. Brown in an article entitled "Practical Applications of Chemical Shift Imaging," *NMR Biomed.*, Vol. 5, pp. 238–243 (1992), worsens for smaller ratios of FOV/number-of-phase-encodes.

HSI for multivoxel localization was proposed by Bolinger, et al. in an article entitled "Hadamard Spectroscopic Imaging (HSI) for Multivolume Localization," *J. Magn. Reson.*, Vol. 80, pp. 162–167 (1988). As described by Goelman, et al. in an article entitled "Transverse Hadamard Spectroscopic Imaging," *J. Magn. Reson*, Vol. 89, pp. 437–454 (1990), in transverse HSI, the spins' relative phases, $\phi$, are spatially encoded parallel or anti-parallel, $\phi=0°$ or $180°$ (denoted "+" or "−"), corresponding to the $\pm 1$'s of the $i^{th}$ row of a Hadamard matrix of order N, $\overline{H}_N$, $N=2^n$, $n=1,2\ldots$. This is accomplished by applying a shaped RF pulse in the presence of a gradient. The experiment is repeated N times, each for a different row of $\overline{H}_N$. In matrix notation, a 1D-HSI experiment along the x direction, for example, is described as $$H_N \cdot \overline{L}_x^\omega(t) = \overline{S}_N^\omega(t), \; H_N^{-1} = \frac{1}{N}H_N = \frac{1}{N}H_N^T \quad [1]$$

where $\overline{L}_x^\omega(t)$ is the vector of localized signals from the N VOI's along x and $\overline{S}_N^\omega(t)$ is a vector of the N observed signals.

$\overline{L}_x^\omega(t)$ is obtained by multiplying $\overline{S}_n^\omega(t)$ with $\overline{H}_N^{-1}{}_N$.

Although many matrices fulfill the condition of Equation [1], only a "natural" $\overline{H}_N$ should be used to properly suppress interference from signals from outside the VOI. In particular, the inventors have found that a Hadamard matrix in which the sum of the elements of every row except one sums to zero yields the best results. Such a preferred 4th order matrix is illustrated below in Equation [2].

To illustrate this, consider the observed signal, $\overline{S}_4^\omega(t)$, encoded according to the "natural" $\overline{H}_4^a$ versus a different, $\overline{H}_4^b$, used by Dreher and Leibfritz in a similar experiment in a rat brain described in an article entitled "Double-Echo Multislice Proton Spectroscopic Imaging Using Hadamard Slice Encoding," *Magn. Reson. Med.*, Vol. 31, pp. 596–600 (1994):

$$\overline{S}_4^{a(t)} = \begin{pmatrix} 1 & 1 & 1 & 1 & \epsilon \\ 1 & -1 & 1 & -1 & \epsilon \\ 1 & 1 & -1 & -1 & \epsilon \\ 1 & -1 & -1 & 1 & \epsilon \end{pmatrix} \begin{pmatrix} L_1(t) \\ L_2(t) \\ L_3(t) \\ L_4(t) \\ \zeta(t) \end{pmatrix} \text{ versus } \overline{S}_4^{b(t)} = \quad [2]$$

$$\begin{pmatrix} 1 & 1 & 1 & 1 & \epsilon \\ 1 & -1 & 1 & 1 & \epsilon \\ 1 & 1 & -1 & 1 & \epsilon \\ 1 & 1 & 1 & -1 & \epsilon \end{pmatrix} \begin{pmatrix} L_1(t) \\ L_2(t) \\ L_3(t) \\ L_4(t) \\ \zeta(t) \end{pmatrix}$$

where $\zeta(t)$ denotes the signals from spins outside the VOI, excited due to small deviations, $\epsilon \ll 1$, from an ideal slice profile. Upon reconstruction with the inverse HT, $\overline{H}_N^{-1}$, Equation [2] leads to:

$$\frac{1}{4}H_4^a \; \overline{S}_4^{a(t)} = \overline{L}_x^{a(t)} = \begin{vmatrix} L_1(t)+\epsilon\zeta(t) & 0 & 0 & 0 \\ 0 & L_2(t) & 0 & 0 \\ 0 & 0 & L_3(t) & 0 \\ 0 & 0 & 0 & L_4(t) \end{vmatrix} \text{ versus }$$

$$\frac{1}{4}H_4^b \; \overline{S}_4^{b(t)} =$$

-continued $$\overline{L}_x^{b(t)} = \begin{vmatrix} L_1(t)+\frac{\epsilon\zeta(t)}{2} & 0 & 0 & 0 \\ 0 & L_2(t)+\frac{\epsilon\zeta(t)}{2} & 0 & 0 \\ 0 & 0 & L_3(t)+\frac{\epsilon\zeta(t)}{2} & 0 \\ 0 & 0 & 0 & L_4(t)+\frac{\epsilon\zeta(t)}{2} \end{vmatrix}$$

Although both $\overline{H}_4^a$ and $\overline{H}_4^b$ localize the VOI, only the former also yields destructive interference of the signals from outside the VOI. Even with $\overline{H}_4^a$, the first slice, $L_1$, does not benefit from this effect, as seen from Equation [3]. Its contamination arises from two sources: outside signals, $\epsilon\zeta(t)$ and DC artifacts from incomplete crushing of FIDs following the PRESS 180° pulses. OVS is shown to remove the former, and 180° alternating the phase of the HSI $90°_{\pm}$ pulses between successive CSI phase-encoding steps modulates true signals enabling rejection of the latter.

Figure 2B:
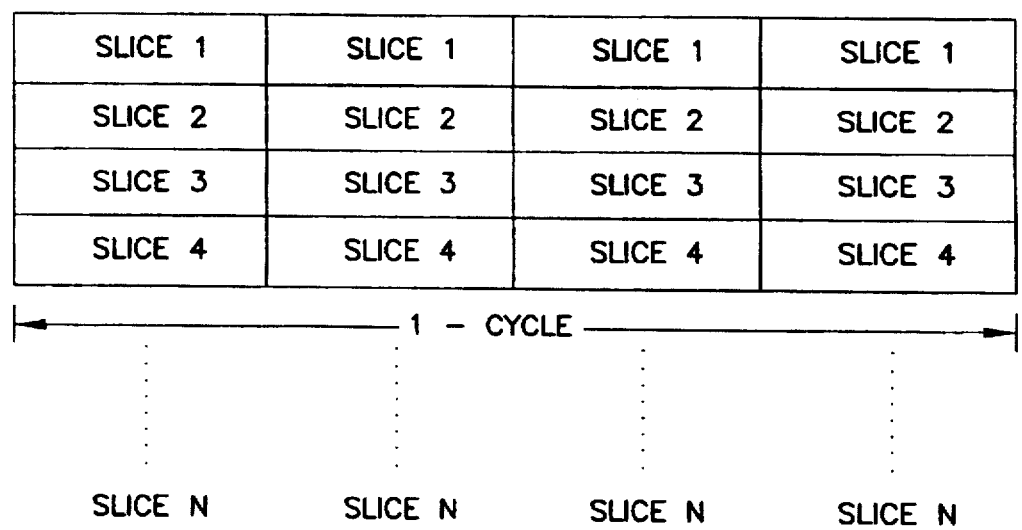
Figure 3:
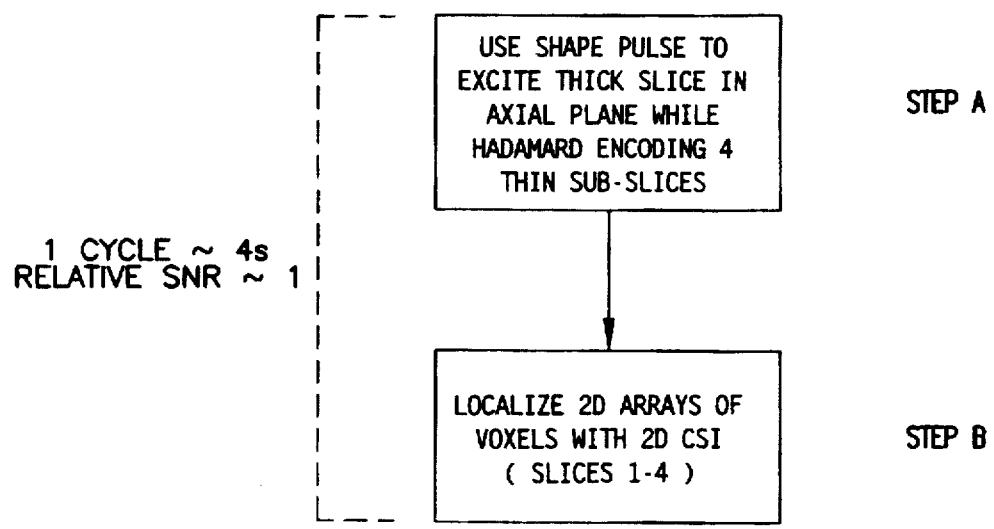
FIG. 3 illustrates the hybrid three-dimensional spectroscopy technique of the invention.

Accordingly, as shown in FIG. 3, the present invention is characterized by selectively exciting a thick slice and generating a selective-excitation pulse for the slice which also Hadamard encodes partitions (sub-slices) across the width of the slice, typically in the short direction, perpendicular to the axial plane of the head for brain imaging (Step A). Two-dimensional CSI is still employed along the other two longer directions in the axial plane in a conventional manner (Step B). As a result of the Hadamard/CSI combination, the spins of the entire VOI are excited and the $^1H$ signal simultaneously acquired for all N slices in the VOI every time, as illustrated in FIG. 2(b). Since both methods excite the spins in the entire VOI, the TR can be made equal to $T_{acq}$ (i) to produce an N-fold increase in the number of acquisitions per given time and a $\sqrt{N}$ gain in the SNR compared with slice-interleaving.

Figure 4:
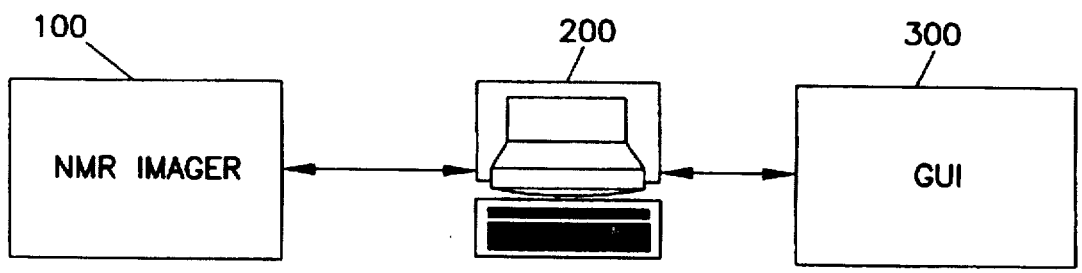
FIG. 4 illustrates a computer graphic software interface to the MR imaging computer and NMR imager of the invention.

As shown in FIG. 4, a computer graphic software interface 300 to the MR imaging computer 200 allows the operator to interactively determine over NMR images where to place the VOI for performing the hybrid three-dimensional spectroscopy and to subsequently request generation of the RF pulses required to perform the measurement. The resulting waveforms can then be generated by any conventional NMR imaging device 100 which is capable of producing shaped pulses. Such computer graphic software is ideally written in a language such that it is portable and may be readily moved from one processor to another as needed.

FIG. 5 is a block diagram showing NMR imaging device 100 in more detail. NMR imaging device 100 is a conventional magnetic resonance imager except that it is programmed to provide hybrid Hadamard and chemical shift imaging in accordance with the techniques of the invention. As illustrated, the NMR imaging device 100 comprises a magnet with gradient and RF coils 110 for creating a magnetic field about the sample or patient and applying a desired pulse sequence generated by computer 210 via transmitter 120, RF power amplifier 130, and gradient amplifier 140 for application to selected slices of the patient's anatomy or object. The resulting MR signal is received by signal receiver 150 and digitized at digitizer 160 for application to computer 210 for processing by three-dimensional spectroscopy software 310 loaded on computer 210 in accordance with the techniques of the invention. The processed signal is then displayed on a display device via display operation interface 220, scan operation interface 230, and/or image display terminal 240. A camera 250 and data memory 260 may also be provided as desired.

Those skilled in the art will appreciate that each of the components in FIG. 5 is standard equipment in commercially available MR imagers such as a 1.5 Tesla Siemens Magnetom 63SP full-body clinical imager. However, as will be explained in more detail below, the computer 210 in such a device is programmed to generate specialized pulse sequences to provide hybrid three-dimensional spectroscopy in accordance with the techniques of the invention. Since software techniques for generating pulse sequences with the characteristics defined below are believed to be well-known to those skilled in the art, such pulse generating techniques will not be described in further detail herein.

An experimental configuration was established to evaluate the hybrid Hadamard and CSI technique of the invention. A standard circularly-polarized head-coil and non-actively-shielded gradients were used in the afore-mentioned NMR imager 100 without any modifications. A three-dimensional CSI-based automatic shimming procedure of the type described by Hu, et al. in an article entitled "A Fast, Reliable Automatic Shimming Procedure Using $^1$H Chemical Shift Imaging Spectroscopy," *J. Magn. Reson. Ser. B*, Vol. 108, pp. 213–219 (1995), produced an approximately 10 Hz full-width at half-maximum water linewidth from the whole head.

Figure 6A:
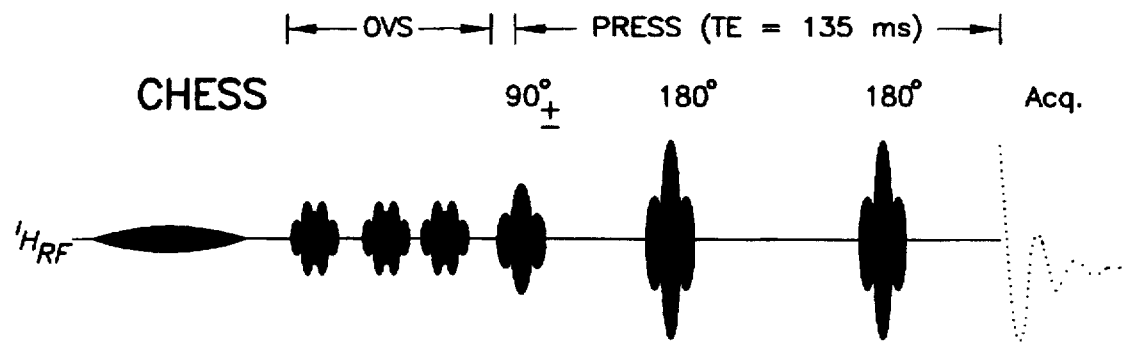
FIGS. 6(a)–6(d) together illustrate the hybrid HSI/CSI localization sequence of the invention used in a three-dimensional $^1$H MRS experiment.
Figure 6B:
Figure 6C:
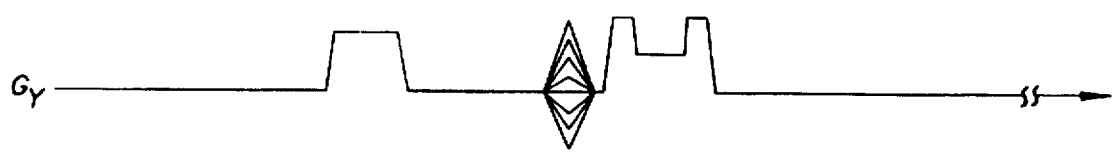
Figure 6D:
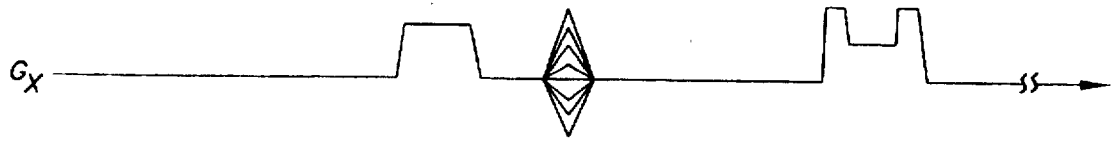

FIGS. 6(a)–6(d) together illustrate the hybrid HSI/CSI localization sequence of the invention used in a three-dimensional $^1$H MRS experiment. As illustrated in FIG. 6(a), a 25.6 ms, 60 Hz bandwidth CHESS was followed by three 5.12 ms long, dual-lobe, time shifted, OVS sinc pulses. The VOI was selectively-excited by PRESS, and its 5.12 ms $90°_\pm$(where $\pm$ denotes 0/180° phase alternation) pulse also $4^{th}$ order HSI encoded along Z under a 3 mTM$^{-1}$ gradient as shown in FIG. 6(b). The PRESS 180° pulses were 5.12 ms long under 1 mTM$^{-1}$. 16×16 two-dimensional CSI was performed during the echo-time by phase-encoding gradient pulses along X and Y as shown in FIGS. 6(c) and 6(d).

Figure 7:
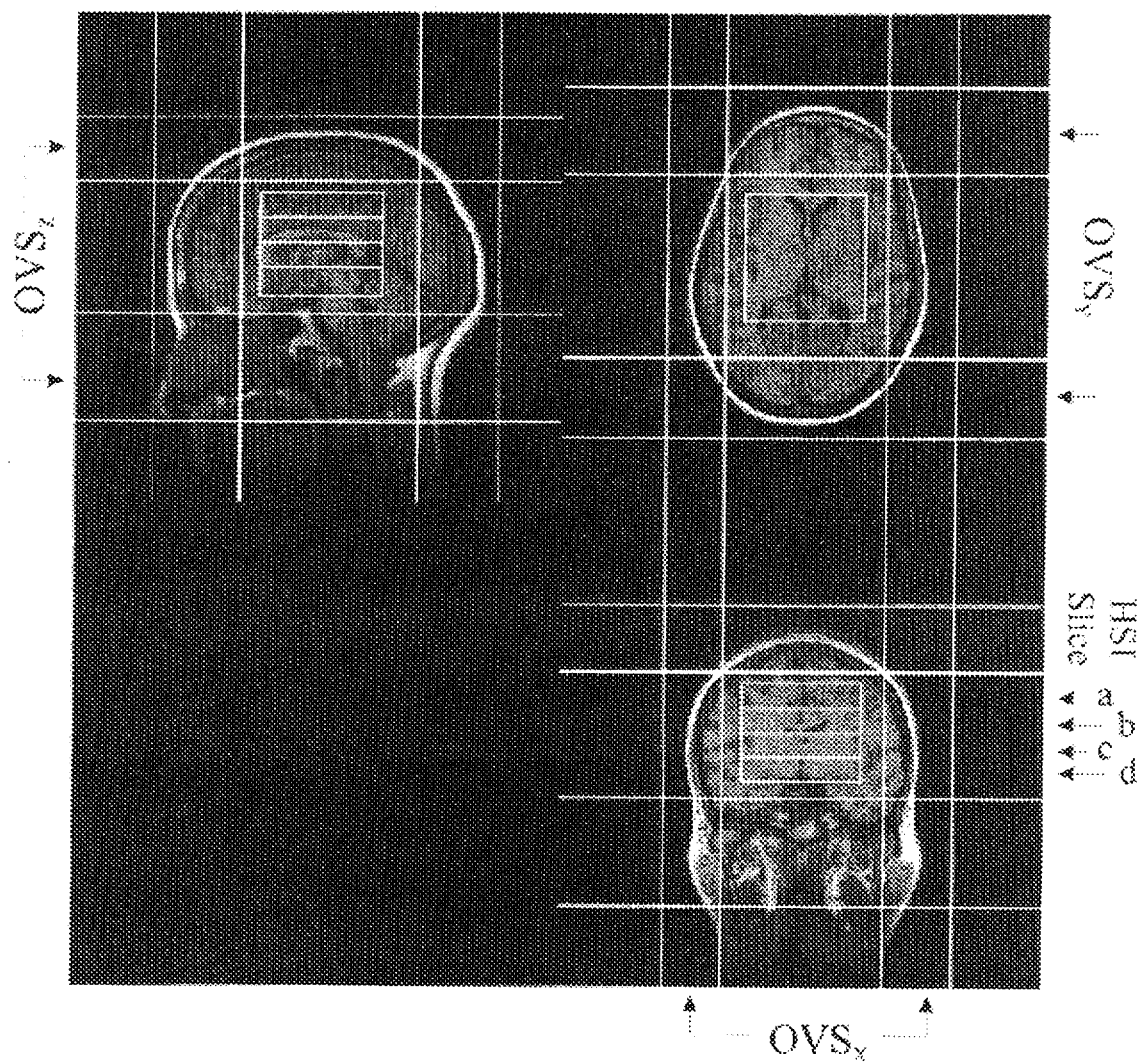
FIG. 7 illustrates a graphical user interface showing the position and size of the PRESS box, OVS bands and four HSI partitions which were interactively image-guided in three perpendicular planes using the techniques of the invention.

The single CHESS pulse of FIG. 6(a) yielded more than 100 fold suppression of the water signal over the VOI. Also, the subcutaneous fat signals were suppressed by more than $10^5$ times by three mechanisms acting in concert:

1. OVS by three consecutive (90+$\epsilon_i$)° dual-lobe sinc pulses in six planes containing the skull outside the VOI, as shown in FIGS. 6(a) and 7. The dual sincs were 30% time-shifted with respect to each other to reduce the peak RF power. This approach was chosen over more elaborate schemes because it is short, approximately 40 ms., and therefore requires only small corrections, $\epsilon_i$=17°, 10° and 5° to compensate for fat signal $T_1$ recovery.

2. Selective-excitation with double-spin echo PRESS sequence of a VOI within the brain, as shown in FIGS. 6(a) and 7. Its size up to 8×8×8 cm was limited by the RF coil's peak RF power limitations.

3. Destructive interference of residual extraneous fat signals in the HSI direction was achieved in post-processing by the add-subtract nature of the Hadamard transform (Equation |3|).

The position and size of the PRESS box, OVS bands and four HSI partitions were interactively image-guided in three perpendicular planes using graphical user interface 300, the graphic front-end of which is shown in FIG. 7. As shown, the PRESS box is interactively placed on any image with the correct perspective automatically maintained on the others. The HSI direction is then chosen and OVS bands individually placed in each direction. The software then generates all the shaped pulses in FIG. 6. Preferably, interface 300 is implemented in the portable IDL graphic language and outputs all the shaped RF waveforms in FIG. 6(a) and shaped gradient waveforms in FIGS. 6(b)–6(d). This process which takes 2–3 min. is performed in parallel with the shimming, adding no time to the acquisition session's length.

The experimental MRI and $^1$H MRS data were processed off-line. The reconstruction poses no difficulties since, as explained by Gonen, et al. in an article entitled "Hybrid Three Dimensional (1D-Hadamard, 2D-Chemical Shift Imaging) Phosphorus Localized Spectroscopy of a Human Brain," *Magn. Reson. Med.*, Vol. 33, pp. 300–308 (1995), the order of performing the Hadamard, spatial or spectral Fourier transforms is not important. The signals were time-domain filtered, with a 1 Hz Gaussian, Fourier transformed in the temporal and two spatial dimensions and Hadamard transformed along the third spatial direction. The spectra were baseline corrected using a modified PIQABLE linear-quadratic fit algorithm of the type described by Nelson, et al. in an article entitled "The Accuracy of Quantification From 1D NMR Spectra Using the PIQABLE Algorithm," *J. Magn. Reson.*, Vol. 84, pp. 95–109 (1989) and viewed as arrays with or on the appropriate images.

HSI Slice Profiles

To assess the actual HSI slice-profiles under the conditions to be used in vivo, one-dimensional spin-echo imaging was performed in a 12×20 cm (diameter×length) cylindrical saline phantom. Such imaging is a far more sensitive test of slice-profile due to its sub-millimeter spatial resolution. Four one-dimensional experiments were done, each using a HSI pulse representing a different row of $\bar{H}_4^a$ in Equation |2| for slice-selection. The four resulting one-dimensional images, shown in FIGS. 8(a)–8(d), were Hadaard transformed according to Equation |1| to yield the localized slice profiles shown in FIG. 8(e).

Figure 8A:
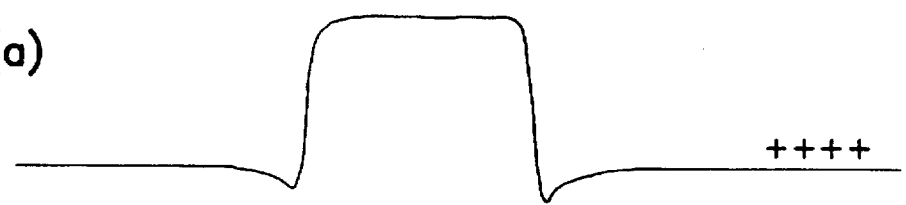
FIGS. 8(a)–8(d) illustrate one-dimensional spin-echo (TE=35 ms) images ($S^\infty_n(\omega)$ in Equation |1|) of $_4{}^{th}$ order HSI spin distributions in a 12×20 cm diameter×length saline cylinder.
Figure 8B:
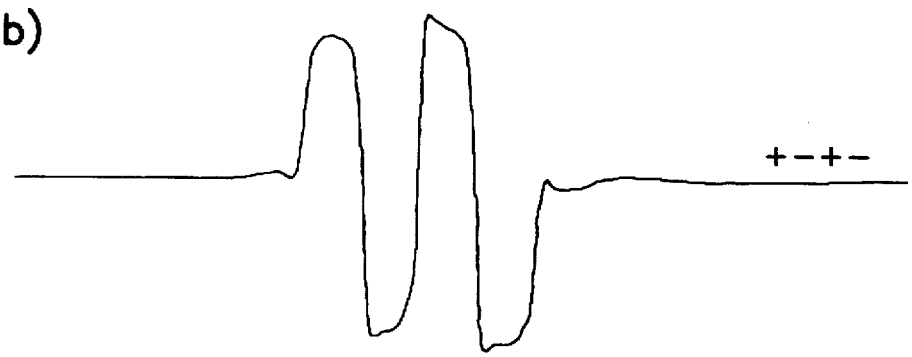
Figure 8C:
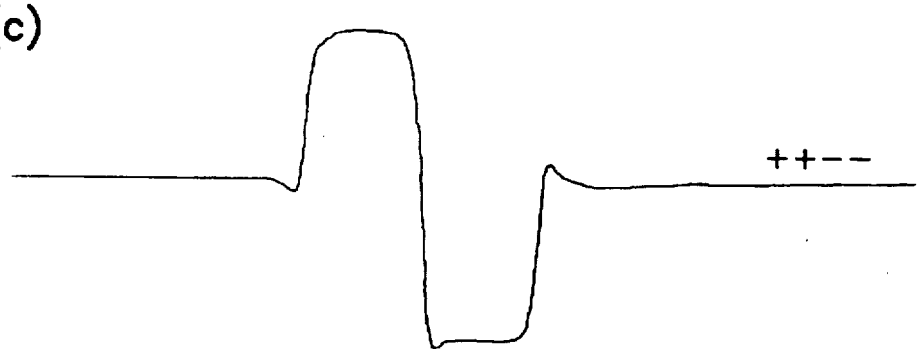
Figure 8D:
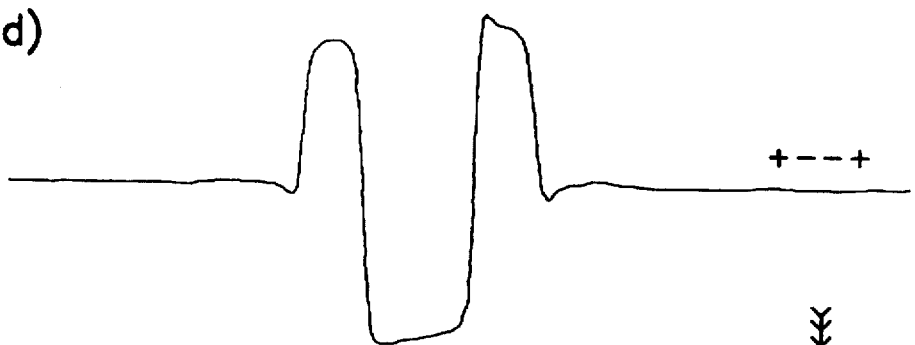
Figure 8E:
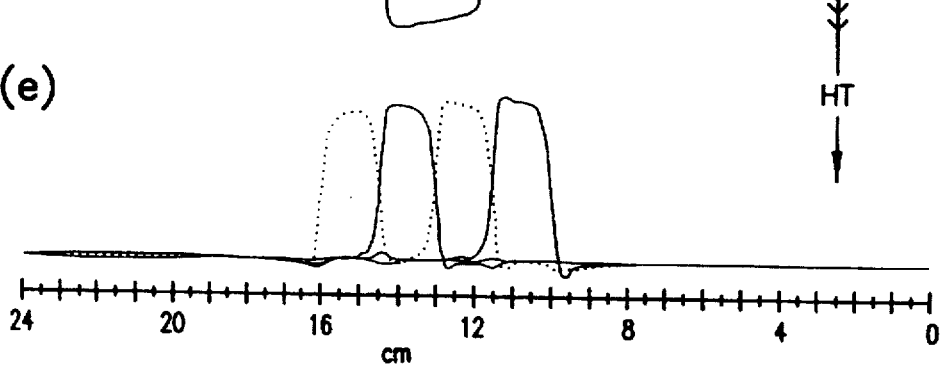
FIG. 8(e) illustrates the Hadamard transform of FIGS. 8(a)–8(d) to yield the four localized slice profiles, $L^\infty_x(\omega)$ in Equation |1|.

In particular, FIGS. 8(a)–8(d) illustrate one-dimensional spin-echo (TE=35 ms) images, $S^\omega_n(\omega)$ in Equation |1|, of $4^{th}$ order HSI spin distributions in a 12×20 cm diameter×length saline cylinder. The 90° Hadamard encoding pulses were 5.12 ms long under a 3 mT-M$^{-1}$ gradient. The spatial-resolution of the 1024 point image was 0.25 mm, and the HSI VOI thickness was 6 cm. All traces are on common space/frequency and intensity scales. FIG. 8(e), on the other hand, illustrates the Hadamard transform of FIGS. 8(a)–8(d) to yield the four localized slice profiles, $L^\omega_n(\omega)$ in Equation |1|. FIG. 8(e) illustrates the short-range slice overlap (voxel bleed), sharp ±0.8 mm transitions, and nearly rectangular slice profiles.

Since $\Delta\omega \cdot \Delta T \approx 1$, a $\Delta T$=5.12 ms RF pulse has a frequency-profile slope $\Delta\omega \approx 200$ Hz. The 3 mTM$^{-1}$ (1300 Hz·cm$^{-1}$) HSI gradient leads to 200 Hz/1300 Hz·cm$^{-1}$≈±0.08 cm slope observed as interslice overlap in FIG. 8(e). This approximately 10% contamination in the 1.5 cm partitions in the HSI direction is analogous to CSI's "voxel-bleed" with the following distinctions: it affects only adjoining slices and not the entire FOV; it does not depend on the number of partitions, their thickness, or the FOV; and it can be reduced by increasing the pulse duration, gradient strength, or both.

HSI fat exclusion.

To verify the spectral-isolation and fat suppression obtained with HSI, a phantom comprising a 12×12 cm (diameter×length) cylinder divided into 7 adjacent, 1.5 cm thick, disk-like compartments was used. The effective width of each compartment, less the width of the wall, was 1 cm. The partitions contained either corn oil, water or 0.1M proton metabolites in 130 mM saline to properly load the coil. A sagittal spin-echo image of the phantom is shown in FIG. 9.

Figure 9:
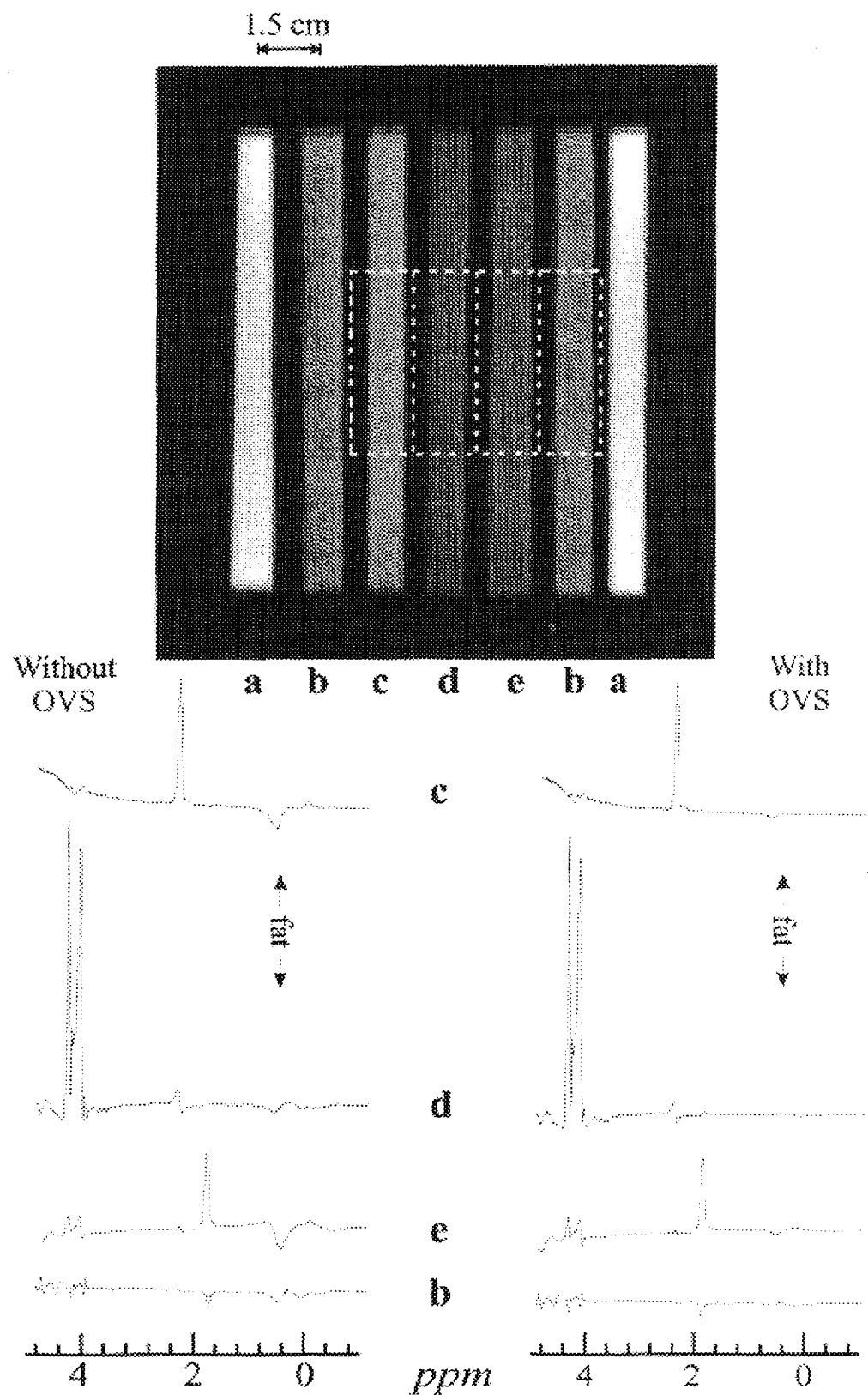
FIG. 9 illustrates a sagittal image with the location of the PRESS box and HSI slices of a phantom used to verify one-dimensional-HSI's localization and fat-rejection.

FIG. 9 illustrates a sagittal image with the location of the PRESS box and HSI slices of the phantom used to verify one-dimensional-HSI's localization and fat-rejection. The 12 cm diameter 1.5 cm thick cylindrical partitions each contained: a-corn oil, b-130 mM saline, c-e 0.1M of Na-acetate, trimethylphosphate, and p-toluenesulphonic acid. The spectra from the corresponding slices b-e in the phantom obtained by $4^{th}$ order HSI without OVS (left) and with OVS in the HSI direction (right) shows the additional fat-suppression.

Comparing the oil to metabolite signals in FIG. 9 shows that the former is attenuated, ~$10^4$ fold, from ~100M to below the level of the 0.1M metabolites, over the 0.5 cm separation of the plastic walls between partitions a and b. To further improve the fat rejection, an OVS pulse was applied in the Gz direction. The results, processed identically and shown in FIG. 9, demonstrate that HSI+OVS essentially eliminate the entire oil signal. The spectra in FIG. 9, also indicate limited "bleed" between adjacent slices, albeit helped by the plastic wall between the partitions. The exact amount of this bleed can be assessed from FIG. 8(e) and only affects adjacent slices.

In vivo human brain

To test in vivo performance of the technique of the invention, the hybrid experiment was performed on a 43 year old female volunteer. A 7.5×7.5×6 cm PRESS box was excited within the brain with the OVS shown in FIG. 7. The FOV was partitioned into 16×16 two-dimensional CSI and $4^{th}$ order HSI to yield 1.5×1.5×1.5 cm voxels. At TR=1.6 seconds, which was shown by Gonen, et al. in an article entitled "In Vivo Phosphorus Polarization Transfer and Decoupling From Protons in 3D Localized NMR Spectroscopy of Human Brain," *Magn. Reson. Med.*, Vol. 37, pp. 301–306 (1997), to be optimal for metabolite $T_1s$ of 1–1.4 second and 90° nutation angle, the measurement required 27 min. The spectra from the HSI slices a–d at the coronal projection in FIG. 7, are superimposed on the axial images in FIGS. 10(a)–10(d), respectively.

Figure 10A:
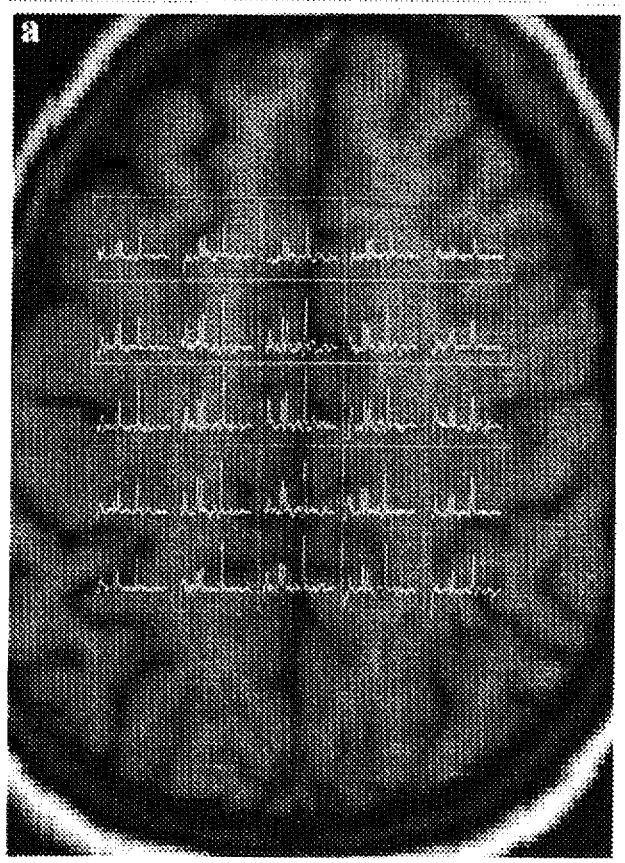
FIGS. 10(a)–10(d) illustrate the full three-dimensional data from a hybrid experiment for the HSI slices (a–d) of FIG. 7.
Figure 10B:
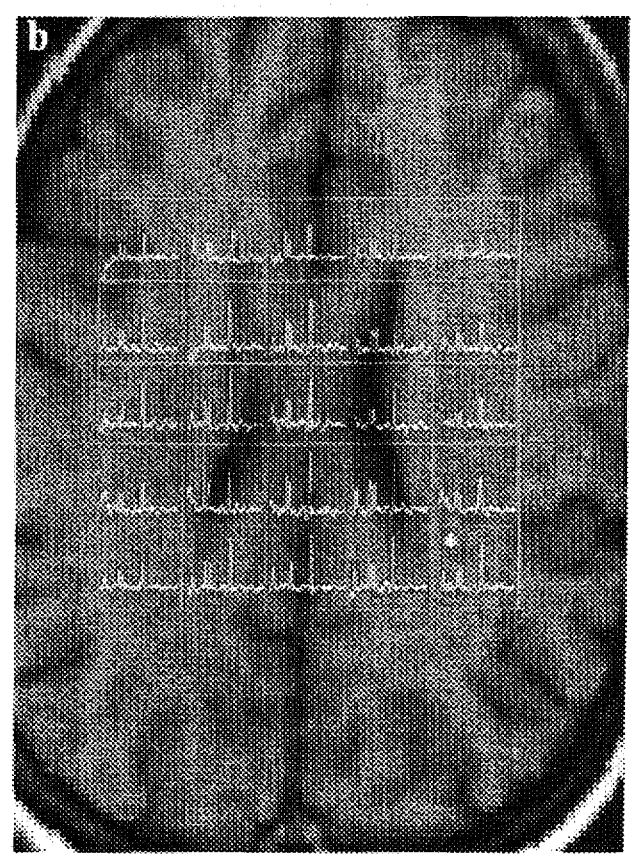

FIGS. 10(a)–10(d) illustrate the full three-dimensional data from a hybrid experiment. The location of the HSI slices (a–d) are shown in FIG. 7. The PRESS box was 7.5×7.5×6 cm and the voxel size 1.5×1.5×1.5 cm. The spectra from each HSI partition are superimposed on the axial image and the grid marks the nominal voxel boundaries. The horizontal (0.3–4.2 ppm region) and vertical scales are common. The $^1$H spectrum marked with an asterisk in FIG. 10(b) is expanded in FIG. 11, which also illustrates an average sum of the spectra from all 100 voxels (thin line, bottom). Peak assignments are in accordance with the description by Majors, et al. in an article entitled "Short Echo Time Proton Spectroscopy of Human Brain Using Gradient Head Coil," *Magn. Reson. Imag.*, Vol. 10, pp. 649–654 (1992), and by Michaelis, et al. in an article entitled "On the Identification of Cerebral Metabolites in Localized $^1$H NMR Spectra of Human Brain in vivo," *NMR Biomed*, Vol. 4 (1991).

FIGS. 10(a)–10(d) show a good correlation between spectral characteristics and the underlying anatomy, namely, larger signals in gray matter (slices 10a and 10b, center column), and smaller where the voxels involve ventricles (slices 10c and 10d). None of the 100 spectra display any extraneous fat contamination upfield from the N-acetyl aspartate (NAA) at 2.0 ppm. As set forth by Hugg, et al. in an article entitled "Elevated Lactate and Alkalosis in Chronic Human Brain Infarction Observed by $^1$H and $^{31}$P MR Spectroscopic Imaging," *J. Cereb. Blood Flow Metab.*, Vol. 12, pp. 734–744 (1992), and by Negendank, et al. in an article entitled "Proton MR Spectroscopy in Patients with Glial Tumors: A Multicenter Study," *J. Neurosurgery*, Vol. 84, pp. 449–458 (1996), this qualifies the hybrid for studies of abnormal lipid, alanine and lactate resonances associated with tumors and stroke. The SNR is sufficient for analysis of peak areas of NAA at 2.0 ppm, choline (Cho) at 3.2 ppm, and creatine/phosphocreatine (cr/PCr) at 3.0 ppm. As described in the afore-mentioned Negendank et al. article, by Negendank in an article entitled "Studies of Human Tumors by MRS: A Review," *NMR Biomed.*, Vol. 5, pp. 303–324 (1992), and by Preul, et al. in an article entitled "Linear Discriminant Analysis Based on Proton MR Spectroscopic Imaging of Human Brain Tumors Improves Pre-operative Diagnosis," "2nd SMR San Francisco, 1994," p. 125, these ratios are commonly used to distinguish between normal brain and its pathology.

Figure 10C:
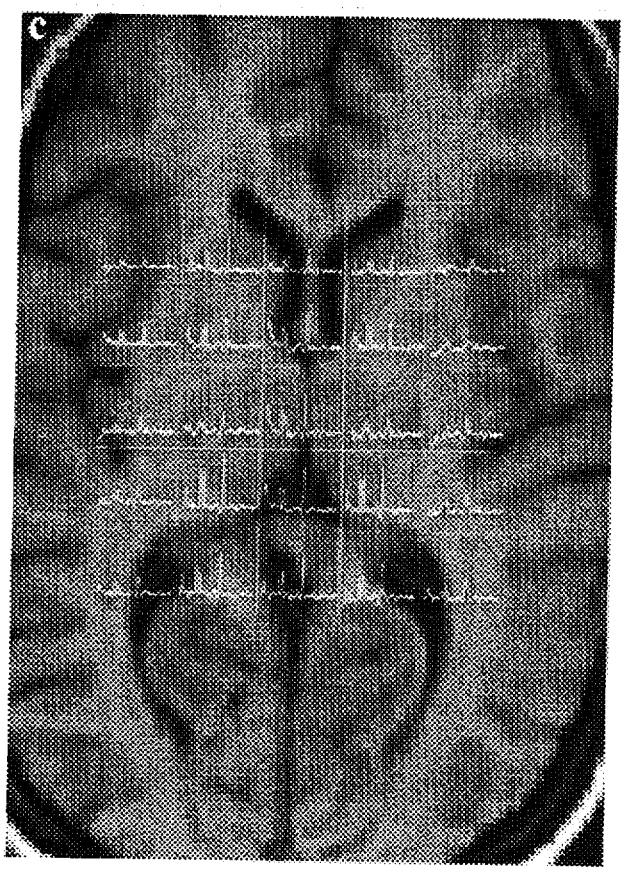
Figure 10D:
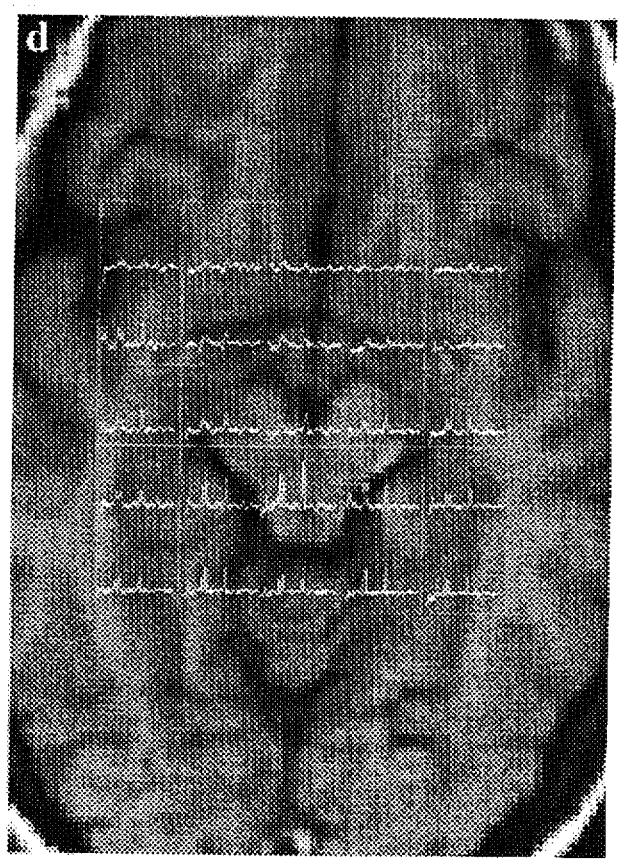

Comparison of the spectra shows slight asymmetry between the left and right sides in FIGS. 10(b) and 10(c). This is probably due to two factors. First, the PRESS box is not precisely centered, as seen from the position of the brain midline in the center column of voxels. Second, the volunteer's head was slightly tilted, as seen from comparing the ventricles in FIG. 10(b). The deterioration of the spectra in the anterior rows in FIG. 10(d) reflects susceptibility anisotropy from the air-tissue interface in the sinuses below, as seen in the sagittal position of the box in FIG. 7.

Figure 11:
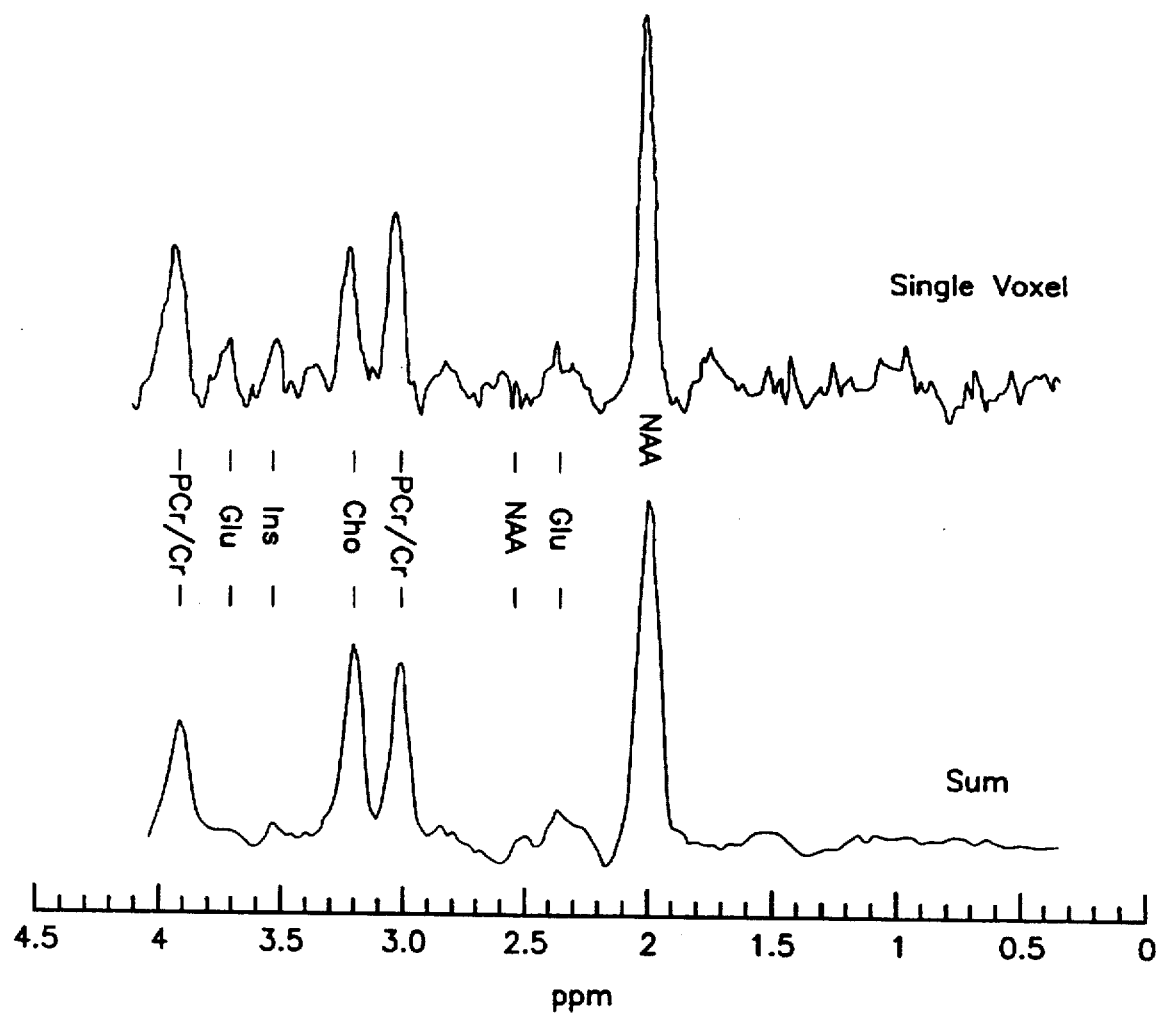
FIG. 11 illustrates an expanded view of the $^1$H spectrum marked with an asterisk in FIG. 10(b) as well as an average sum of the spectra from 100 voxels.

To demonstrate the performance of a 27 minute hybrid designed in accordance with the techniques of the invention, a single 3.4 ml voxel has been expanded in FIG. 11. In addition to the main signals mentioned above, other, lesser intense signals are visible: PCr/Cr at 3.96 ppm, glutamate/glutamine (Glu) at 3.75 and 2.38 ppm, inositol (Ino), at 4.57 ppm, and NAA at 2.53 ppm. The statistical significance of these low SNR peaks is established by comparing them to the sum of all the spectra, showing that these minor peaks are consistent with the entire data. The intensities of the peaks are different in the single spectrum and the sum, due to metabolite level heterogeneity over the VOI.

SNR per unit time comparison

Figure 12A:
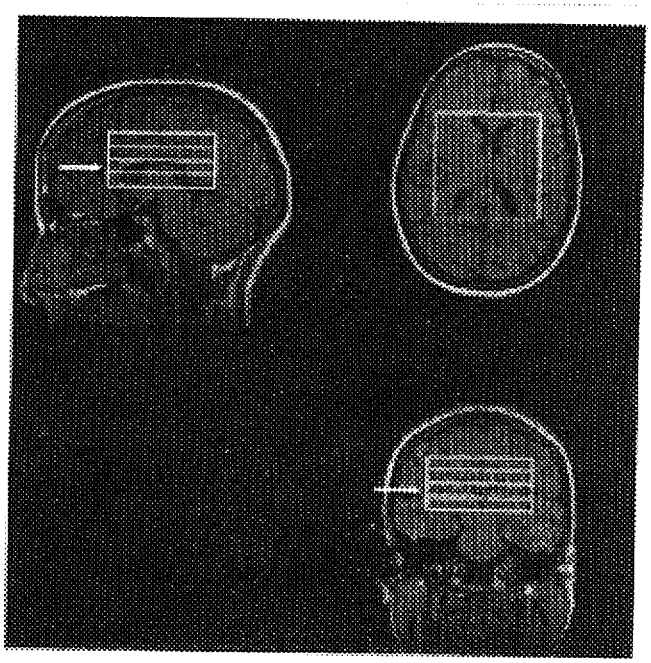
FIG. 12(a) illustrates the location of the PRESS box and HSI partitions in a volunteer.

To compare the performance of the hybrid technique of the invention, "H", versus sequential-interleaved multislice, "SM", two experiments were performed "back to back" without changing the volunteer's position or any instrumental parameter. FIG. 12(a) illustrates the location of the PRESS box and HSI partitions in the volunteer. The PRESS boxes were 8×8×($4^H$ or $1^{SM}$) cm partitioned to yield 1×1×1 cm voxels. The $4^{SM}$ VOIs were each placed to overlap with a different HSI partition. At a TR of 1.6 second, each experiment required 27 minutes. The interleaved acquisitions were done one two-dimensional slice at a time in order to have the same TR and $T_1$ weighting.

Figure 12B:
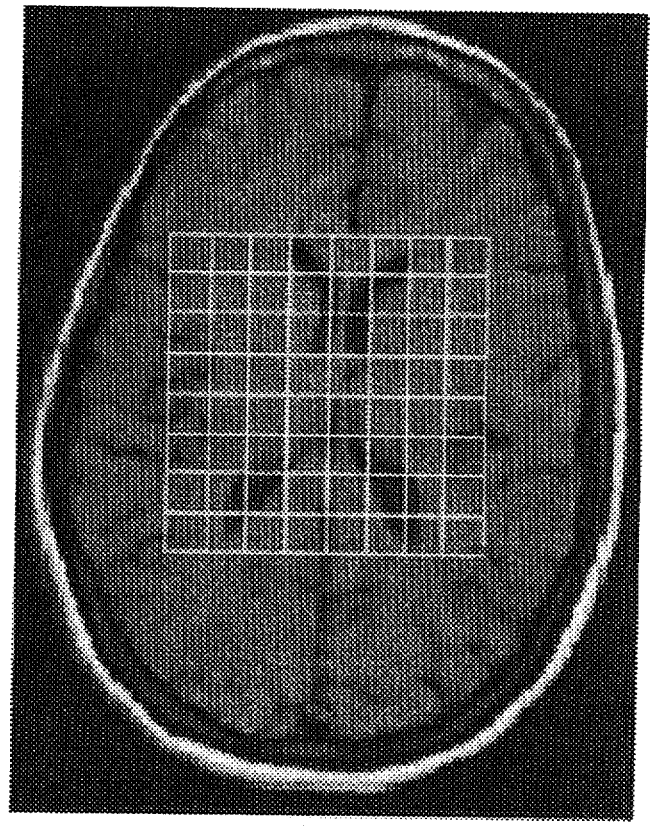
FIG. 12(b) illustrates the axial image from the HSI slice marked with the arrow in FIG. 12(a) with the PRESS box and nominal 1×1×1 cm voxel boundaries.
Figure 12C:
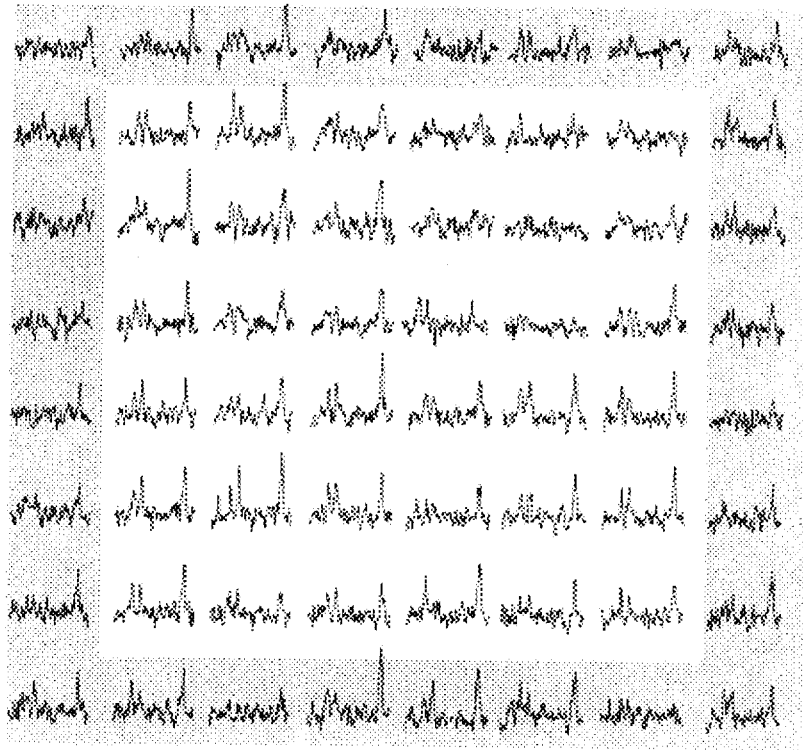
FIG. 12(c) illustrates 8×8$^1$H spectra from a sequential-interleaved two-dimensional experiment from the slice of FIG. 12(a).
Figure 12D:
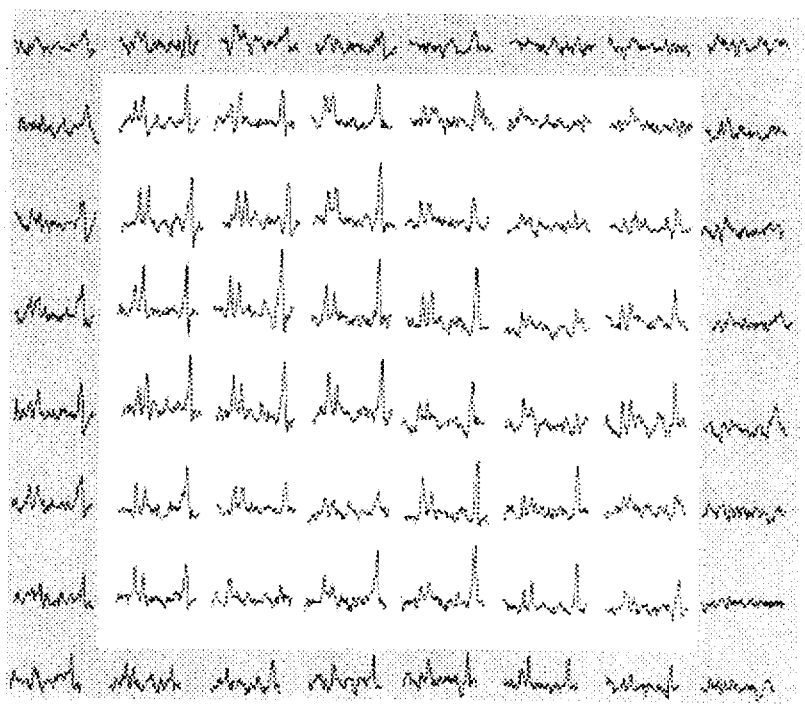
FIG. 12(d) illustrates the spectra from the same location illustrated in FIG. 12(c) but obtained with the hybrid three-dimensional spectroscopic technique of the invention, whereby the dramatic increase in SNR afforded by the invention becomes evident.

The axial image of slice 3, marked with an arrow in FIG. 12(a), and richest in cerebral features, is shown in FIG. 12(b), which illustrates the axial image from the HSI slice marked with the arrow in FIG. 12(a) with the PRESS box and nominal 1×1×1 cm voxel boundaries. FIG. 12(c) illustrates 8×8 $^1$H spectra from a sequential-interleaved two-dimensional experiment from the slice, while FIG. 12(d) illustrates the spectra from the same location obtained with the hybrid. All spectra were normalized to fill the same vertical scale and 1.8–4 ppm of proton chemical shift. Visual comparison reveals that the noise level in FIG. 12(d) in accordance with the invention is significantly lower than in FIG. 12(c), as quantitated in Table 1 below, which shows the average areas over all 144 voxels in the VOI of the hybrid of the invention compared with the sequential two-dimensional interleaved-slice acquisition for the $^1$H metabolites and the standard deviation, σ, of the noise. The correspondence of the spectral features between FIGS. 12(c) and 12(d) is excellent, despite the different localization methods used to obtain them. Both display loss of $^1$H-metabolite signal in the ventricles (most prominent in the top right quadrant). As will be appreciated by those skilled in the art, the spectra in the gray zones at the edges are distorted due to slice profile imperfections.

Relative performance was assessed by comparing the SNR of each metabolite line in the proton spectrum. The spectra in each set were processed in the same way and the peak areas obtained using Principal Component Analysis (PCA), as described by Stoyanova, et al. in an article entitled "Application of Principal Component Analysis in Spectroscopy: A Novel Approach for Spectral Quantitation," *J. Magn. Reson. Ser. A,* Vol. 115, pp. 265-269 (1995). The average signal and noise scores for the two measurements are given in Table 1 below. As expected, a $\sqrt{N}$ improvement in SNR is obtained by the hybrid due to the total MRS examination length available to all its N slices. A two-fold reduction in the noise-σ for the hybrid of the invention is illustrated.

TABLE 1

|  | Noise-σ | Cho | Cr | NAA |
|---|---|---|---|---|
| Hybrid | 10.4 | 453 | 448 | 836 |
| Sequential | 18.7 | 361 | 364 | 689 |

As noted above, ΔT=5.12 ms 180° PRESS pulses had a Δω≈200 Hz frequency-profile slope. With the 1mTM$^{-1}$ (~420 Hz·cm$^{-1}$) gradients used for both 180° pulses, this slope extended over 200 Hz/420 Hz·cm$^{-1}$≈0.5 cm. Nutational-angle gradients across the 1 cm voxels in gray zones at the edges of the VOI in FIGS. 12(c) and 12(d) resulted in signal loss due to incomplete refocusing and phase artifacts. The gradient in the HSI(Z) direction was much stronger, ~1300 Hz·cm$^{-1}$, and the effect of these artifacts are negligible perpendicular to the plane of the slices.

To improve the SNR in multislice acquisition, the number of scans can be increased by eliciting multiple spin-echoes in every TR, as described by Duyn and Moonen in the afore-mentioned articles. However, this come at the cost of degrading the spectral-resolution due to short, 128 ms, acquisition and a need to correct for $T_2$-weighting in post processing. Therefore, this strategy becomes less effective as the voxel $T_2^*$ approaches $T_2$. The hybrid method of the invention does not suffer from either problem.

Robustness

To reduce the adverse consequence of interruption due to either patient or instrumental factors, the hybrid technique of the invention can be applied in a specific order. In particular, the approximately 7 minute HSI acquisitions described by the i=1 row of $\overline{H}_4$, (++++), is done first. At its end, 16×16 spectra from the entire VOI are available (but at fourfold voxel thickness). Next, the i=3 row is performed, which completes $2^{nd}$ order HSI, doubling the spatial resolution. The i=2 and i=4 slices follow to complete the reconstruction. A relative uncertainty in the position of different metabolites (chemical shift artifact) along the HSI direction arises from the selective 90°±. Under 3mT·M$^{-1}$ gradient and ~2.5 ppm chemical shift between lactate and choline, this amounts up to a maximum of ±0.07 cm. Localization in the plane of the slices is performed by CSI, so no such artifact is incurred in these directions.

Specific Absorption Rate

To assess the specific absorption rate (SAR) associated with the hybrid technique of the invention, it was assumed that most of the RF power of a sinc pulse is in its central lobe. Approximating this lobe with a rectangular pulse of duration equal to the inverse bandwidth yields: (i) At TR=1.6 seconds, each OVS pulse deposited ~0.3 W; and (ii) the PRESS pulses contributed ~1.2 W each. Assuming 3 Kg for the average head, the ~4.6 W accrued deposited ~1.5 W·kg$^{-1}$. This is not only under the FDA's 3.2 W·kg$^{-1}$ SAR guidelines for the head, but also within both the stricter 2 W·kg$^{-1}$ SAR guideline in the UK and the new international standard IEC 601-2-33 of 3 W·kg$^{-1}$ over any minute period.

CONCLUSION

Per given MRS examination time, simultaneous three-dimensional acquisition in accordance with the techniques of the invention is more efficient than interleaving N individual slices by $\sqrt{N}$. Together with approximately 25 minutes for subject-loading, coil-tuning, shimming and MRI, the hybrid MRS procedure of the invention requires under 1 hour, and is easily tolerated by most people. An additional advantage is simplicity, for the RF waveforms can be implemented on any imager capable of generating shaped pulses. Moreover, the "building-blocks" used (CHESS, OVS and PRESS) are themselves standard sequences, available in any commercial spectroscopy package.

Although exemplary embodiments of the invention have been described in detail above, those skilled in the art will appreciate that many additional modifications are possible in the exemplary embodiments without materially departing from the novel teachings and advantages of the invention. For example, those skilled in the art will appreciate that two-dimensional Hadamard spectroscopy imaging (transverse, longitudinal, or both) and one-dimensional chemical shift imaging may be used with the same result, where specific hybrids may be used for specific applications. Accordingly, all such modifications are intended to be included within the scope of this invention as defined in the following claims.

We claim:

1. A nuclear magnetic resonance (NMR)-based method for obtaining proton ($^1$H) localized spectroscopic data indicative of the chemical composition of a human body organ, comprising the steps of:

(A) subjecting the organ to electromagnetic energy sufficient to cause a response signal indicative of the chemical composition of said organ throughout a relatively thick cross-sectional slice comprising a prescribed number N of relatively thinner sub-slices; and (B) processing said response signal, using a Hadamard matrix comprising N rows in which a sum of all but one of said N rows is equal to zero, to obtain an array of proton ($^1$H) localized spectroscopic voxel data for each of said N sub-slices, wherein each said array is indicative of the chemical composition of said organ within a corresponding sub-slice of said organ.

2. A method as recited in claim 1, wherein step (A) comprises exciting said relatively thick slice while simultaneously Hadamard encoding said relatively thinner sub-slices.

3. A method as recited in claim 1, wherein step (A) comprises the generation of a PRESS double spin-echo pulse sequence.

4. A method as recited in claim 1, wherein step (B) comprises the use of two-dimensional chemical shift imaging (CSI) to obtain localized two-dimensional arrays of voxel data for each said sub-slice.

5. A nuclear magnetic resonance (NMR)-based method for obtaining three-dimensional proton ($^1$H) localized spectroscopic data indicative of the chemical composition of a human body organ, comprising the steps of:

(A) obtaining at least one N dimensional array of localized proton $^1$H spectra of said human body organ by applying a chemical shift imaging sequence to a slice of said human body organ, thereby subjecting said human body organ to electromagnetic energy sufficient to cause a first response signal indicative of the chemical composition of said human body organ to be generated;

(B) obtaining at least one M dimensional array of localized proton $^1$H spectra of said human body organ by applying a Hadamard spectroscopy imaging sequence to said slice of said human body organ so as to cause a second response signal indicative of the chemical composition of said human body organ within respective sub-slices of said slice, where $N \neq 0$, $M \neq 0$, and N+M equals 3; and (C) generating a three-dimensional proton ($^1$H) spectroscopic image of said slice of said human body organ from said first and second response signals using a Hadamard matrix comprising N rows in which a sum of all but one of said N rows is equal to zero.

6. A method as recited in claim 5, wherein said chemical shift imaging sequence is applied in a two-dimensional axial plane of said human body organ and said Hadamard spectroscopy imaging sequence is appled along a remaining axis of said human body organ.

7. A method as recited in claim 5, wherein said Hadamard spectroscopy imaging sequence is applied along a transverse axis of said human body organ, a longitudinal axis of said human body organ, or both of said axes.

* * * * *

UNITED STATES PATENT AND TRADEMARK OFFICE
CERTIFICATE OF CORRECTION

PATENT NO. : 5,903,149
DATED : 05/11/99
INVENTOR(S) :
Oded Gonen, et al.

It is certified that error appears in the above-identified patent and that said Letters Patent is hereby corrected as shown below:

Col. 5, line 9, "$\theta$" should be --$\varphi$--;

Col. 5, line 10, "$\theta$" should be --$\varphi$--.

Signed and Sealed this

Third Day of April, 2001

*Attest:*

NICHOLAS P. GODICI

*Attesting Officer*   *Acting Director of the United States Patent and Trademark Office*